(12) United States Patent
Itakura et al.

(10) Patent No.: US 6,809,580 B2
(45) Date of Patent: Oct. 26, 2004

(54) SWITCHED CAPACITOR FILTER CIRCUIT AND METHOD OF FABRICATING THE SAME

(75) Inventors: Toshikazu Itakura, Toyota (JP); Seiki Aoyama, Toyohashi (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/396,455

(22) Filed: Mar. 26, 2003

(65) Prior Publication Data

US 2003/0197553 A1 Oct. 23, 2003

(30) Foreign Application Priority Data

Apr. 19, 2002 (JP) .......................................... 2002-117603

(51) Int. Cl.[7] .................................................. H03K 5/00
(52) U.S. Cl. ...................................... 327/554; 327/262
(58) Field of Search ........................... 327/94, 554, 262; 330/9

(56) References Cited

U.S. PATENT DOCUMENTS 4,651,037 A * 3/1987 Ogasawara et al. ......... 327/389
6,075,401 A 6/2000 Inoue et al. ................. 327/427
6,653,967 B2 * 11/2003 Hamashita ................... 341/172

FOREIGN PATENT DOCUMENTS

| JP | A-59-117318 | 7/1984 |
| JP | H5-243944 | 9/1993 |
| JP | H8-204509 | 8/1996 |
| JP | H9-284096 | 10/1997 |

* cited by examiner

*Primary Examiner*—Dinh T. Le
(74) *Attorney, Agent, or Firm*—Posz & Bethards, PLC

(57) ABSTRACT

In a switched capacitor filter circuit, a switching transistor is connected to an operational amplifier for input of a switching control signal to the operational amplifier. A noise compensation transistor is provided between the switching transistor and the operational amplifier. The drain and the source of the noise compensation transistor are connected to each other. The noise compensation transistor is applied with an inverted signal of the switching signal, and generates feedthrough noise of the polarity inverted from that generated by the switching transistor in order to cancel the feedthrough noise.

10 Claims, 9 Drawing Sheets

SWITCHED CAPACITOR FILTER CIRCUIT AND METHOD OF FABRICATING THE SAME

CROSS REFERENCE TO RELATED APPLICATION

This application is based on and incorporates herein by reference Japanese patent application No. 2002-117603 filed on Apr. 19, 2002.

FIELD OF THE INVENTION

The present invention relates to a switched capacitor filter circuit and a method of fabricating the circuit. Specifically it relates to the switched capacitor filter circuit that can reduce feedthrough noise and the method of fabricating the circuit.

BACKGROUND OF THE INVENTION

Various switched capacitor circuits are proposed.

A switched capacitor integration circuit shown in FIG. 10A is configured with an operational amplifier 403, an input capacitor 404, switching circuits 405, 406, and an integration capacitor 407. An input voltage Vin is inputted to an inverting input terminal of the operational amplifier 403 via the input capacitor 404 and the switching circuit 406, and an output terminal of the operational amplifier 403 is connected to the inverting input terminal via the integration capacitor 407.

The switching circuits 405, 406 simultaneously switch the ground potential and the signal path side with a switching control signal (not shown). The signal path side is the path extended to the inverting input terminal of the operational amplifier 403 via the input capacitor 404 from the input terminal to which the input voltage Vin is impressed. First, when the switches 405, 406 are connected to the ground, the input capacitor 404 is discharged. Next, the switching circuits 405, 406 are connected to the signal path side, the input voltage Vin is impressed to the switching circuit 405 of the input capacitor 404, and the input capacitor 404 is charged. When the switching circuits 405, 406 are switched to the ground, the input capacitor 404 is discharged.

Assuming that capacitance of the input capacitor 404 is C1 and an amount of charge stored in the input capacitor 404 is Q, the amount is expressed as $Q=C1 \cdot Vin$. Also assuming that a current flowing into the input capacitor 404 is i', a switching frequency of a switching control signal (sampling frequency) is fs, and a switching period of the switching control signal is $T=1/fs$. This current is expressed as $i'=Q \cdot fs = C1 \cdot Vin \cdot fs = (C1 \cdot Vin)/T$. As understood from this expression, due to the switching operations of the switching circuits 405, 406, the current i' flows during a period of the switching control signal (not shown). Therefore this circuit may be considered as a resistor for the input signal of sufficiently lower frequency to the frequency fs of the switching control signal.

Assuming the switching circuit 405, capacitor 404, and switching circuit 406 in FIG. 10A are assumed to be equivalent to a resistor 401 of an analog integration circuit composed of an operational amplifier 400 and an integration capacitor 402 shown in FIG. 10B, that is, i=i', the relationship of $R=T/C1=1/(fs \cdot C1)$ is obtained. Also, assuming that capacitance of the integration capacitor 407 in FIG. 10B is C2, cut-off frequency f0 is expressed as $f0=1/(2\pi R \cdot C2) = (fs \cdot C1)/(2\pi C2)$. As described above, the switched capacitor filter circuit is capable of controlling the cut-off frequency f0 with a capacitance ratio of the sampling frequency fs to the input capacitor 404 and integration capacitor 407. Therefore, unlike a large capacitor and an RC filter which are required to have a large scale capacitor or higher accuracy of capacitance, the switched capacitor filter circuit is suitable for integration.

The switched capacitor circuit is used for a first-order filter as shown in FIG. 11. This first-order filter is configured with switching transistors 100 to 107, an input capacitor 110, a limit capacitor 111, an integration capacitor 112, and an operational amplifier 113.

One terminal of the input capacitor 110 is connected to an input terminal IN via the switching transistor 100 and also connected to an internal reference voltage terminal REF (indicated as an inverted triangle) via the switching transistor 104, while the other terminal is connected to an inverting input terminal of the operational amplifier 113 via the second switching transistor 101 and also connected to the internal reference voltage terminal REF via the switching transistor 105. One terminal of the limit capacitor 111 is connected to the inverting input terminal of the operational amplifier 113 via the switching transistor 102 and is also connected to the internal reference voltage terminal REF via the switching transistor 106. The other terminal is connected to an output terminal OUT via the switching transistor 103 and also connected to the internal reference voltage terminal REF via the switching transistor 107. One terminal of the integration capacitor 112 is connected to the inverting input terminal of the operational amplifier 113. The other terminal is connected to an output terminal. It is assumed here that the voltage of input terminal IN is V1, the voltage of the inverting input terminal of the operational amplifier 113 is V2, and the output voltage of the operational amplifier 113 is V3.

With this configuration, the switching transistors 100 to 107 are turned on or off with switching control signals (control signals) φ1, φ2 shown in FIG. 12. The switching transistors 100 to 103 turn on when the control signal φ1 is high level, while the switching transistors 104 to 107 turn on when the control signal φ2 is high level.

When the control signal φ1 is low level and the control signal φ2 is high level, the input capacitor 110 is grounded via the switching transistors 104, 105, while the limit capacitor 111 is grounded via the switching transistors 106, 107 and are then discharged. Under this condition, when both control signals φ1, φ2 are in the low level state, the switching transistors 100 to 107 are all turned off, and thus no currents flow into the input capacitor 110 and the limit capacitor 111.

When the control signal φ1 becomes high level and the control signal φ2 becomes low level, the switching transistors 100 to 103 are turned on, so that a charging current flows into the input capacitor 110 depending on a voltage difference (V1−V2) applied across both terminals, and thereby the input capacitor 110 is charged up to the voltage depending on the voltage difference (V1−V2). Charging current flows into the integration capacitor 112 depending on a voltage difference (V2−V3) applied across both terminals and thereby the integration capacitor 112 is charged up to the voltage depending on the voltage difference (V2−V3).

When both control signals φ1, φ2 become low level, the switching transistors 100 to 103 are turned off, so that no currents flow into the input capacitor 110 and the limit capacitor 111.

As described above, the input capacitor 110 and the limit capacitor 111 become the circuit where predetermined current flows during a period of the control signals φ1, φ2. Therefore it may be considered to be equivalent respectively to resistors. The integration capacitor 112 is charged depending on the voltage difference (V2–V3) applied across both terminals thereof regardless of switching operations in the switching transistors 100 to 107.

The switched capacitor filter circuit in FIG. 11 can be thought, for an input signal of sufficiently lower frequency to the sampling frequency, to be equivalent to a first-order low pass filter as shown in FIG. 13. In this filter, the input capacitor 110 and its associated transistors 100, 101, 104 and 105 are represented as a resistor 120, while the limit capacitor 111 and its associated transistors 102, 103, 106 and 107 are represented as a resistor 130.

As a switched capacitor filter circuit of this type, a "switched capacitor filter" is described in JP-A No. 11-205113.

In this switched capacitor filter circuit, feedthrough noise due to feedthrough capacitance sometimes give adverse effect on its filter characteristics. These feedthrough capacitance and feedthrough noise will be described below.

As illustrated in FIG. 14, a switching transistor has an overlapping area between the gate and drain or the gate and source. Small capacitances are formed in these overlapping areas, and are charged due to the change of a gate signal. These small capacitances are referred to as feedthrough capacitance. These feedthrough capacitances bring about feedthrough noise at the switching transistor in the switched capacitor filter circuit. Specifically, in the switching transistor in FIG. 15A, when a control signal φ in FIG. 15B is inputted under the condition that the input voltage Vin is low level, a voltage change is generated at an output voltage Vout due to the feedthrough capacitance of the switching transistor depending on the change of the control signal φ. Noise appearing in such voltage change is referred to as the feedthrough noise.

Influence of this feedthrough noise will be described using an equivalent circuit of the switched capacitor filter in FIG. 16. This circuit is configured with a switching transistor 600, an input capacitor 601, an integration capacitor 602, and an operational amplifier 603. When the switching transistor 600 is switched with the control signal φ to be inputted to the gate of the switching transistor 600, feedthrough noise is generated due to the feedthrough capacitance of the switching transistor 600 at the inverting input terminal of the operational amplifier 603, so that this feedthrough noise is outputted as an offset voltage to an output voltage Vout at the output terminal via the integration capacitor 602.

Assuming that the feedthrough capacitance of the switching transistor 600 is Ce, capacitance of the integration capacitor 602 is Cf, voltage impressed to the gate of the switching transistor 600 is V; feedthrough noise Vnoise is expressed as follows.

$$Vnoise = (Ce \cdot V)/Cf$$

From this expression, it can be understood that feedthrough noise Vnoise is proportional to a ratio Ce/Cf of the feedthrough capacitance Ce to capacitance Cf. The feedthrough noise is as small as to be negligible when capacitance Cf of integration capacitor is sufficiently larger than feedthrough capacitance Ce. However, when capacitance Cf of the integration capacitor is not sufficiently larger than the feedthrough capacitance Ce, the feedthrough noise becomes larger and the offset voltage due to the feedthrough noise increases, causing the filter characteristic to be deteriorated.

Assuming that unit capacitance to form a switched capacitor filter is C, sampling frequency is f, and capacitance of a capacitor is Cf, the cutoff frequency fc is expressed as follows.

$$fc = (C \cdot f)/(2\pi \cdot Cf)$$

From the above expressions, feedthrough noise Vnoise is expressed as follows.

$$Vnoise = (2\pi \cdot fc \cdot Ce \cdot V)/(C \cdot f)$$

From this expression, it can be understood that feedthrough noise Vnoise depends on the capacitance Cf of capacitor, cutoff frequency fc, and ampling frequency f.

FIG. 17 illustrates simulation result for cutoff frequency in the amount of feedthrough noise. This figure illustrates both characteristics of second-order filters when the sampling frequency f is 60 kHz and 120 kHz, and characteristics of a first-order filter when the sampling frequency f is 60 kHz. When the second-order filters in the figure are compared with each other for the sampling frequency f of 120 kHz and cutoff frequency fc of 400 Hz, and the sampling frequency f of 60 kHz, and cutoff frequency fc of 400 Hz, it can be understood that the feedthrough noise of the latter becomes two times the feedthrough noise of the former. If the second-order filters are compared with each other for the frequencies of f=120 kHz and fc=400 Hz, and the frequencies of f=60 kHz and fc=200 Hz, it can also be understood that the feedthrough noise is identical for both filters. However, the cutoff frequency fc of the former filter becomes two times the cutoff frequency of the latter filter.

The feedthrough noise of the first-order filter, whose sampling frequency f is 60 kHz, is different from the characteristics of the second-order filter, whose sampling frequency f is 60 kHz. This is because two switching transistors which generate feedthrough noise are provided. In the first-order filter of FIG. 11, feedthrough noise is generated by the switching operations of two switching transistors 101, 102, and it is then outputted as an offset voltage to the output terminal OUT via the integration capacitor 112.

SUMMARY OF THE INVENTION

It is an object of the present invention to reduce feedthrough noise in a switched capacitor filter circuit.

In order to achieve the object, according to one aspect of the present invention, in a switched capacitor filter circuit, a first noise compensation transistor is provided in series to a second transistor located at an input terminal side of an operational amplifier for a first and a second transistors allocated at both sides of an input capacitor. This first noise compensation transistor receives, at its gate, a signal in the inverse polarity of the switching control signals inputted to the first and second switching transistors, and cancels feedthrough noise generated in the second switching transistor. Accordingly, this feedthrough noise can be reduced.

According to another aspect of the present invention, a switched capacitor filter circuit is configured as a high-order (higher than the second-order) switched capacitor filter circuit. In this case, feedthrough noise generated by the second switching transistor can be cancelled by providing the first noise compensation transistor in series to the second transistor located at the input terminal side of the operational amplifier for the first and second transistors provided in both sides of the input capacitor in the circuit of the final stage.

According to a further aspect of the invention, a method of fabricating the switched capacitor filter circuit is configured such that, when a ratio of feedthrough capacitance of switching transistor to capacitance of integration capacitor is larger than the predetermined value, wirings to the noise compensation transistor are formed, while when such capacitance ratio is not larger than the predetermined value, such wirings are not formed.

According to the invention, connection or non-connection of noise compensation transistor may be determined only by changing wiring patterns through application of the wiring forming process.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT (First Embodiment)

Figure 1:
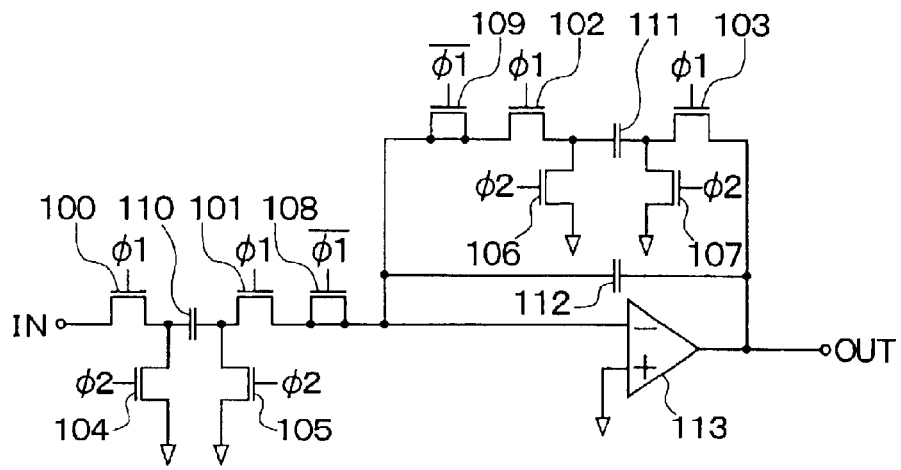
FIG. 1 is a circuit diagram of a switched capacitor filter circuit forming a first-order filter according to the first embodiment of the present invention.
Figure 11:
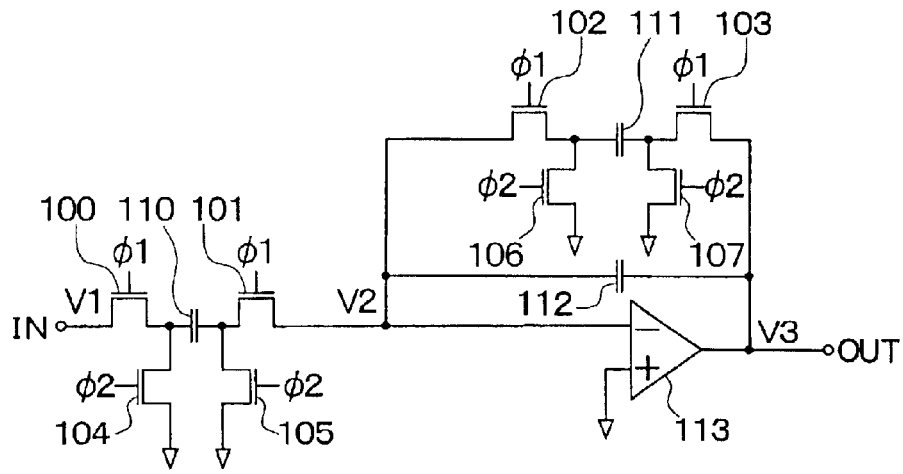
FIG. 11 is a circuit diagram illustrating a first-order filter of switched capacitor according to a related art.
Figure 12:
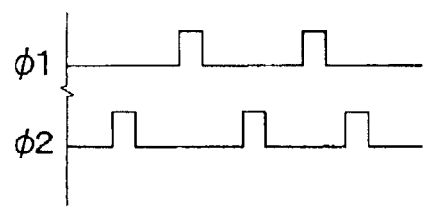
FIG. 12 is a signal diagram of control signals $\phi 1$, $\phi 2$.
Figure 13:
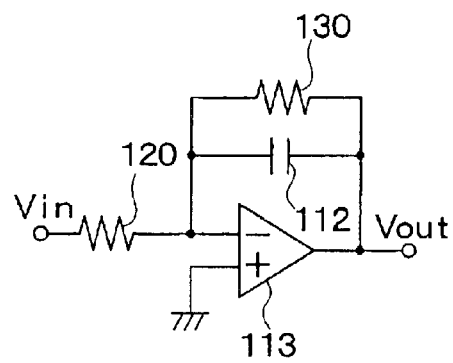
FIG. 13 is a circuit diagram illustrating an equivalent circuit of the switched capacitor filter circuit.
Figure 14:
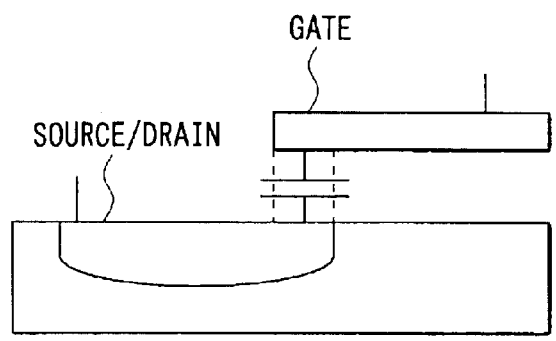
FIG. 14 is a schematic diagram illustrating a switching transistor.
Figure 15A:
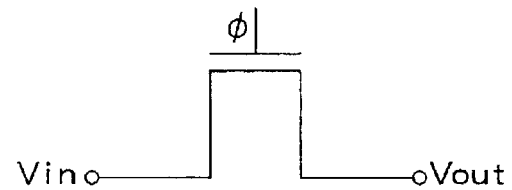
FIGS. 15A and 15B are signal diagrams showing feedthrough noise.
Figure 15B:
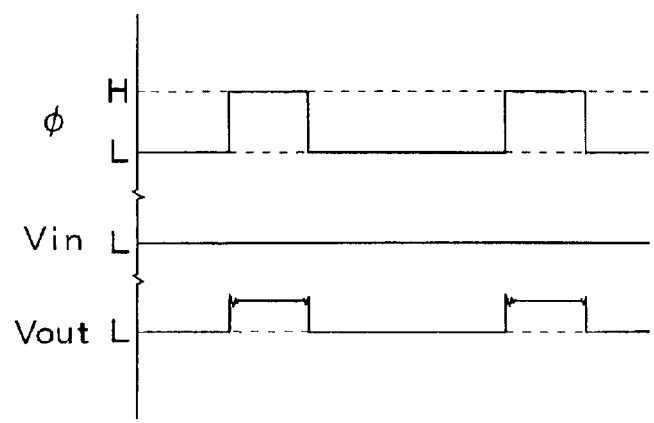
Figure 16:
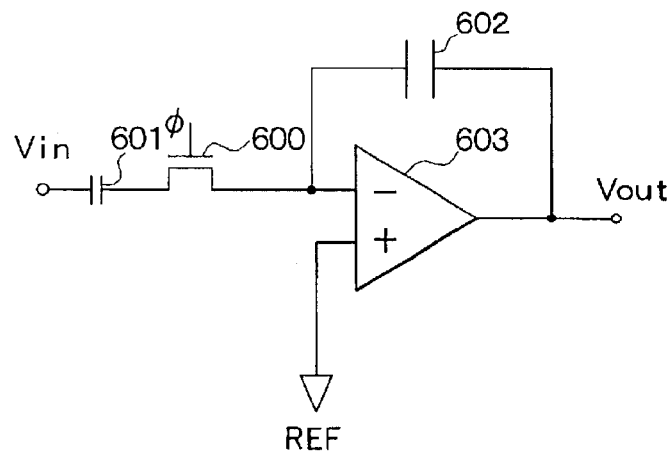
FIG. 16 is a schematic diagram illustrating an equivalent circuit of the switched capacitor filter circuit according to the related art.
Figure 17:
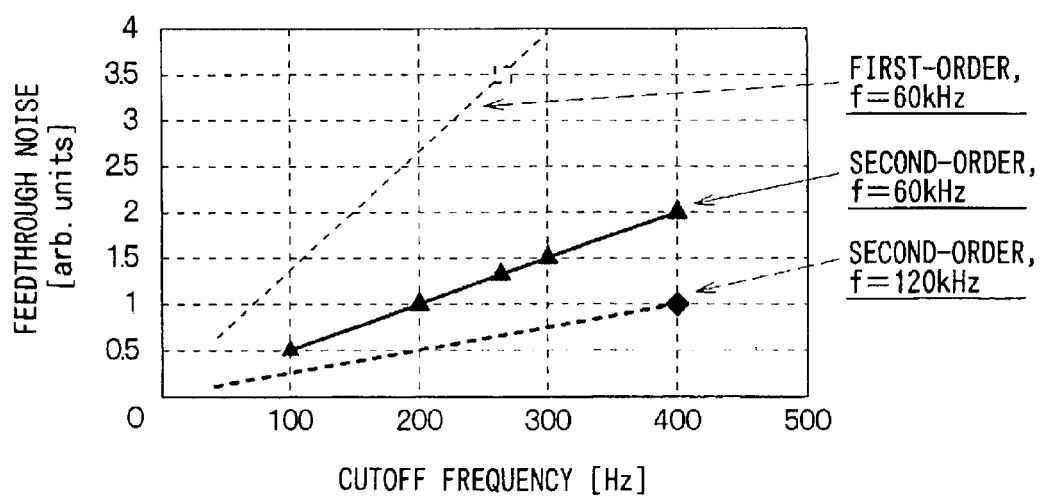
FIG. 17 is a graph illustrating characteristics of feedthrough noise amount for cutoff frequency.

Referring first to FIG. 1, a switched capacitor filter circuit is formed as a first-order filter. It is provided with first and second noise compensation transistors 108, 109 in addition to the switched capacitor filter circuit shown in FIG. 11. Drains and sources of the first and second noise compensation transistors 108, 109 are respectively connected between the switching transistors 101, 102 and the inverting input terminal of the operational amplifier 113. When a control signal $/\phi$ inverted from the control signal $\phi$ inputted to the gates of switching transistors 101, 102 is inputted to the gates, these noise compensation transistors 108, 109 cancel feedthrough noise generated by the switching transistors 101, 102.

Figure 2A:
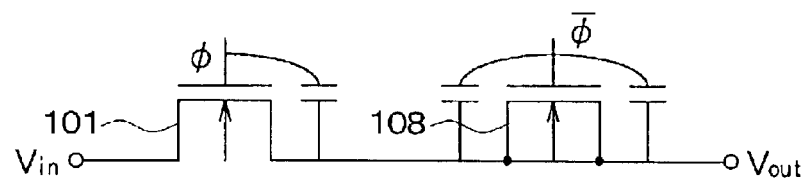
FIGS. 2A and 2B are schematic diagrams showing a combination of a switching transistor and a noise compensation transistor, and a process of fabricating the switched capacitor filter circuit.

Cancellation of this feedthrough noise will be described below. FIG. 2A illustrates a circuit where the switching transistor 101 and the first noise compensation transistor 108 are connected in series. The switching transistor 101 generates feedthrough noise between the gate and source thereof when the control signal $\phi$ changes. Since the first compensation transistor 108 performs switching operation when a control signal $/\phi$ inverted from the control signal $\phi$ is inputted to the gate thereof, this transistor 108 generates both feedthrough noise and feedthrough noise of inverted polarity generated by the switching transistor 101.

Here, when the first noise compensation transistor 108 and the switching transistor 101 have equal characteristics, since the first noise compensation transistor 108 generates feedthrough noise between the gate and the drain and between the gate and the source, the amount of this feedthrough noise is equal to two times the feedthrough noise of the switching transistor 101. In this case, the amount of the feedthrough noise of switching transistors becomes equal with each other by setting the gate length of switching transistors 101 and 108 to constant value and then setting the gate width of switching transistor 101 to two times the gate width of the first noise compensation transistor 108. Accordingly, feedthrough noise can be cancelled.

Figure 3:
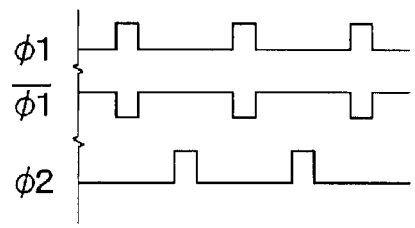
FIG. 3 is a signal diagram of control signals $\phi 1$, $/\phi 1$, and $\phi 2$.

The second noise compensation transistor 109 also operates in the same manner as the first switching transistor 108. It is capable of canceling feedthrough noise generated by the switching transistor 102. Therefore, the circuit in the first embodiment can operate as the switched capacitor filter circuit when the control signals of $\phi 1$, $/\phi 1$, and $\phi 2$ in the timings of FIG. 3 are used and is also capable of reducing feedthrough noise appearing at the output terminal OUT.

Figure 2B:
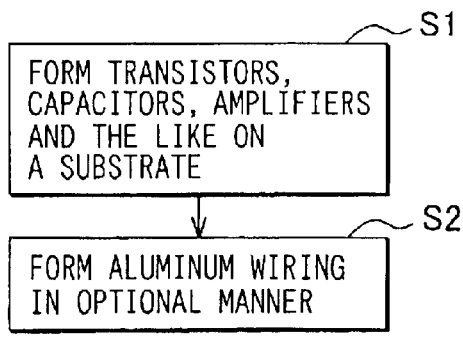

The switched capacitor filter circuit of this embodiment is formed as a semiconductor integrated circuit as shown in FIG. 2B. In a wafer process in the fabrication process of this semiconductor integrated circuit, switching transistor group, capacitor group, and a plurality of operational amplifiers are formed on a semiconductor substrate at step S1; and various elements are connected by the aluminum wiring process to form the aluminum wirings prepared in the latter half processes of the wafer process in an optional manner at step S2. The capacitor group is formed of a plurality of capacitors having the constant unit capacitance. The capacitance can be varied by the number of capacitors connected. Therefore, various switched capacitor filter circuits of various cutoff frequencies and various number of orders can be formed by varying capacitance and filter configuration through modifications of wiring patterns in the aluminum wiring process.

In addition, in this embodiment, whether wiring should be formed or not to connect in series the first and second compensation transistors 108, 109 to the switching transistors 101, 102 between the switching transistors 101, 102 and the inverting input terminal of the operational amplifier 113 can also be set with the wiring pattern in the aluminum wiring process.

Namely, in the case of forming a filter where a ratio of the feedthrough capacitance of the switching transistors 101, 102 to the integration capacitance thereof is larger than the predetermined value (for example, Ce/Cf<0.00002), the wiring pattern is introduced to form the wiring between the first and second noise compensation transistors 108, 109 and switching transistors 101, 102. Moreover, in the case of forming a filter where the ratio of feedthrough capacitance of the switching transistors 101, 102 to integration capacitance thereof is smaller than the predetermined value (for example, Ce/Cf≧0.00002), the wiring pattern is introduced not to form the wiring between the first and second noise compensation transistors 108, 109 and switching transistors 101, 102.

This method does not require a new wiring process and can set connection and non-connection of the first and second noise compensation transistors 108, 109 only by varying the wiring pattern in the aluminum wiring process. Accordingly, feedthrough noise can be reduced depending on various cutoff frequencies and the number of orders of filter.

Selection for connection and non-connection of the noise compensation transistor with such aluminum wiring process is also possible even in the embodiments described below.

(Second Embodiment)

Figure 4:
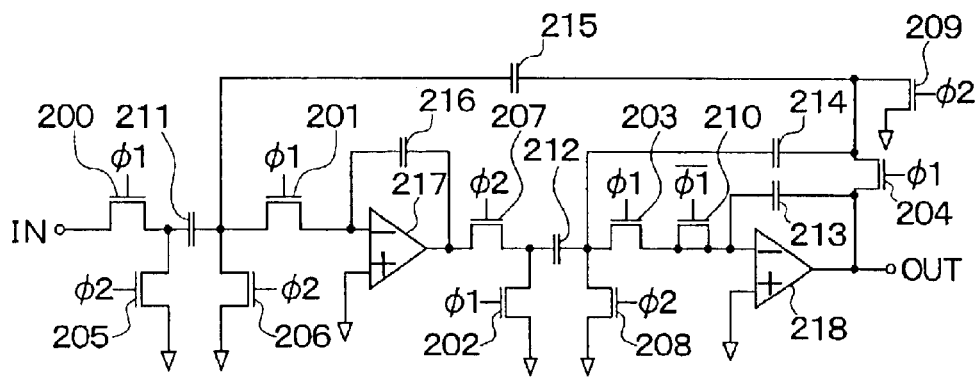
FIG. 4 is a circuit diagram of the switched capacitor filter circuit forming a second-order filter according to the second embodiment of the present invention.

FIG. 4 illustrates a switched capacitor filter circuit of the second embodiment of the present invention. This switched capacitor filter circuit is formed as a second-order filter and is configured with switching transistors 200 to 209, a noise compensation transistor 210, input capacitors 211, 212, integration capacitors 213 to 216 and operational amplifiers 217, 218.

One terminal of the input capacitor 211 is connected to the input terminal IN via the switching transistor 200 and is also connected to the internal reference voltage terminal REF via the switching transistor 205, while the other terminal is connected to the inverting input terminal of the operational amplifier 217 via the switching transistor 201 and is also connected to the internal reference voltage terminal REF via the switching transistor 206. Moreover, one terminal of the integration capacitor 216 is connected to the inverting input terminal of the operational amplifier 217 and the other terminal thereof to an output terminal.

In addition, one terminal of the input capacitor 212 is connected to an output terminal of the operational amplifier 217 via the switching transistor 207 and is also connected to the internal reference voltage terminal REF via the switching transistor 202, while the other terminal thereof is connected to the inverting input terminal REF of the operational amplifier 218 via the switching transistor 203 and is also connected to the internal reference terminal REF of the switching transistor 208.

Moreover, one terminal of the switching transistor 204 is connected to the inverting input terminal of the operational amplifier 218 via the integration capacitor 213 and is also connected to the output terminal of the operational amplifier 218, while the other terminal is connected to a connecting point of the input capacitor 212 and switching transistor 203 via the integration capacitor 214 and is also connected to a connecting point of the input capacitor 211 and switching transistor 201 via the integration capacitor 215 and moreover to the internal reference voltage terminal via the switching transistor 209. Moreover, the noise compensation transistor 210 connects a source terminal and a drain terminal thereof and is connected to the inverting input terminal of the operational amplifier 218.

In the above configuration, the switching transistors 200 to 209 are turned on and off with the control signals φ1, /φ1, and φ2 illustrated in FIG. 3. The switching transistors 200 to 204 turn on when the control signal φ1 is high level, while the noise compensation transistor 210 turns on when the control signal /φ1 is high level and the switching transistors 205 to 209 turn on when the control signal φ2 is high level.

In the second-order filter configured as above, an offset voltage due to feedthrough noise is generated when the switching transistor 203 performs the switching operation with the control signal φ1. The noise compensation transistor 210 is switched with the control signal /φ1 which is inverted from the control signal of the switching transistor 203 to generate feedthrough noise in the polarity inverted from that generated by the switching transistor 203. Thereby, the feedthrough noise can be cancelled.

In the first-order filter illustrated in FIG. 1, feedthrough noise is generated by the switching operations of the two switching transistors 101, 102 and it is outputted as an offset voltage to the output terminal OUT via the integration capacitor 112. Meanwhile, in the second-order filter illustrated in FIG. 4, feedthrough noise is generated by switching operation of the switching transistor 203 and it is outputted as an offset voltage to the output terminal OUT via the integration capacitor 213. Accordingly, the offset voltage due to feedthrough noise of the second-order filter becomes equal to ½ of the offset voltage due to feedthrough noise of the first-order filter.

Figure 5A:
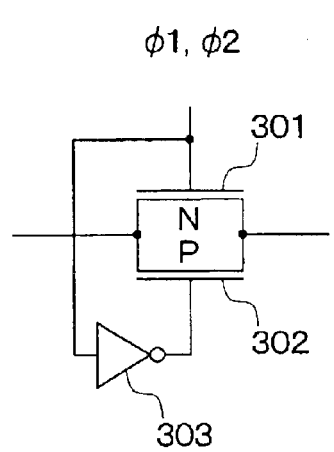
FIGS. 5A and 5B are schematic diagrams illustrating another example of switching transistor and noise compensation transistor.

In these first and second embodiments, as the switching transistors 100 to 107 and 200 to 209, the transistor of the configuration illustrated in FIG. 5A may be used. Namely, as illustrated in FIG. 5A, an N-channel type transistor 301 and a P-channel type transistor 302 are connected in parallel. The control signal φ1 or φ2 is inputted to the gate of N-channel type transistor 301, while a signal inverted from the control signal φ1 or φ2 by an inverter 303 is inputted to the gate of the P-channel type transistor 302.

Figure 5B:
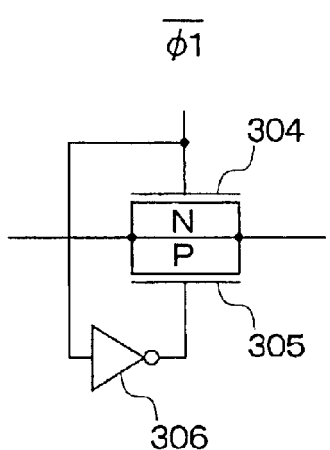

In this case, the noise compensation transistors 108, 109, and 210 are configured as illustrated in FIG. 5B. The circuit of FIG. 5B connects in parallel an N-channel type transistor 304 and a P-channel type transistor 305. The control signal /φ1 or /φ2 is inputted to the gate of N-channel type transistor 304, while a signal inverted from the control signal /φ1 or /φ2 by an inverter 306 is inputted to the gate of P-channel type transistor 305. Moreover, the source terminals and drain terminals of the N-channel type transistor 304 and P-channel type transistor 305 are connected respectively.

(Third Embodiment)

Next, a switched capacitor filter circuit will be described as a third embodiment of high-order (three-order or more) filter. A high-order filter is configured with combination of the first-order filter and the second-order filter of the first and the second embodiments.

Figure 6:
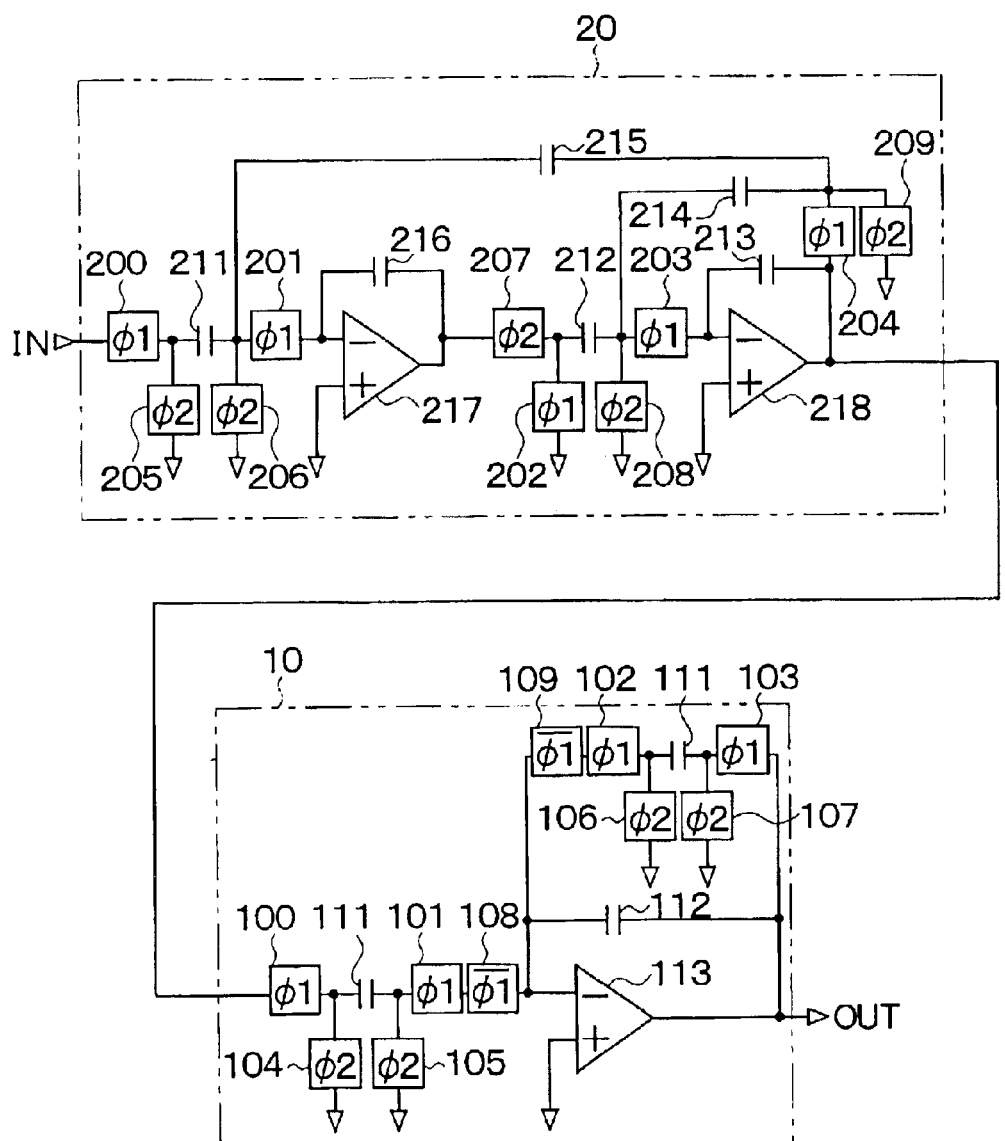
FIG. 6 is a circuit diagram of a switched capacitor filter circuit forming a third-order filter according to the third embodiment of the present invention.
Figure 7:
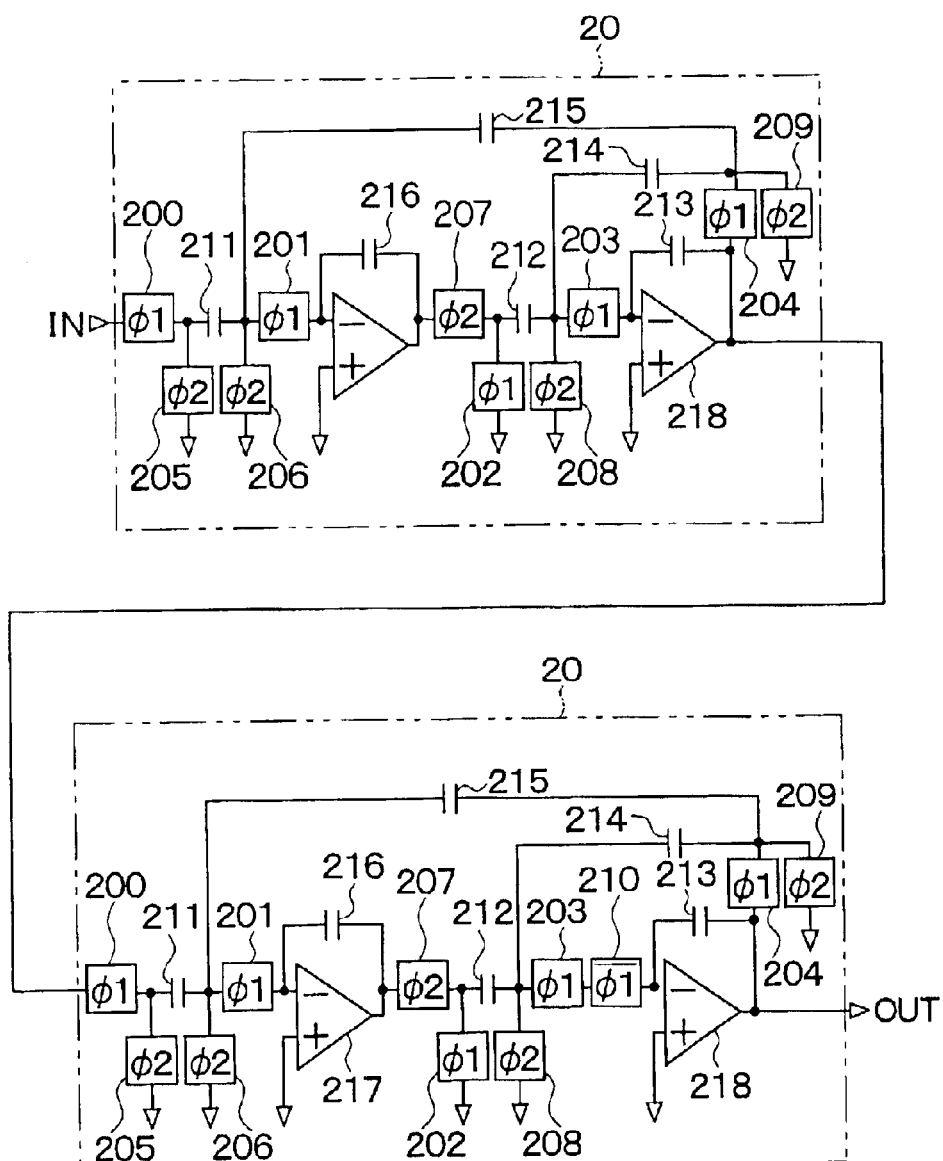
FIG. 7 is a circuit diagram of a switched capacitor filter circuit forming a fourth-order filter according to the fourth embodiment of the present invention.

FIG. 6 and FIG. 7 illustrate the switched capacitor filter circuits formed as the third-order filter and fourth-order filter. Circuits 100 to 107, 200 to 209, 300 to 309 illustrated as the blocks are switching transistors illustrated in FIG. 1 and FIG. 4 or switching transistors illustrated in the configuration of FIG. 5A and perform the switching operations with a control signal illustrated in the block. Moreover, circuits 108, 109, and 210 illustrated in the block are also noise compensation transistors illustrated in FIG. 1 and FIG. 4 or noise compensation transistor in the configuration of FIG. 5B and perform the switching operations with a control signal illustrated in the block.

The third-order filter illustrated in FIG. 6 is formed of serial connection of the second-order filter 20 and first-order filter 10. In this third-order filter, offset voltage due to feedthrough noise is generated by the switching transistors 101, 102 of the first-order filter in the subsequent stage. Therefore, like the first embodiment, feedthrough noise can be cancelled by connecting in series the noise compensation transistors 108 and 109.

A fourth-order filter illustrated in FIG. 7 is formed by serial connection of two second-order filters 20. In this fourth-order filter, offset voltage due to feedthrough noise is generated by the switching transistor 203 of the second-order filter 20 in the subsequent stage. Therefore, like the second-order filter, feedthrough noise can be cancelled by connecting in series the noise compensation transistor 210 to the switching transistor 203.

Figure 8A:
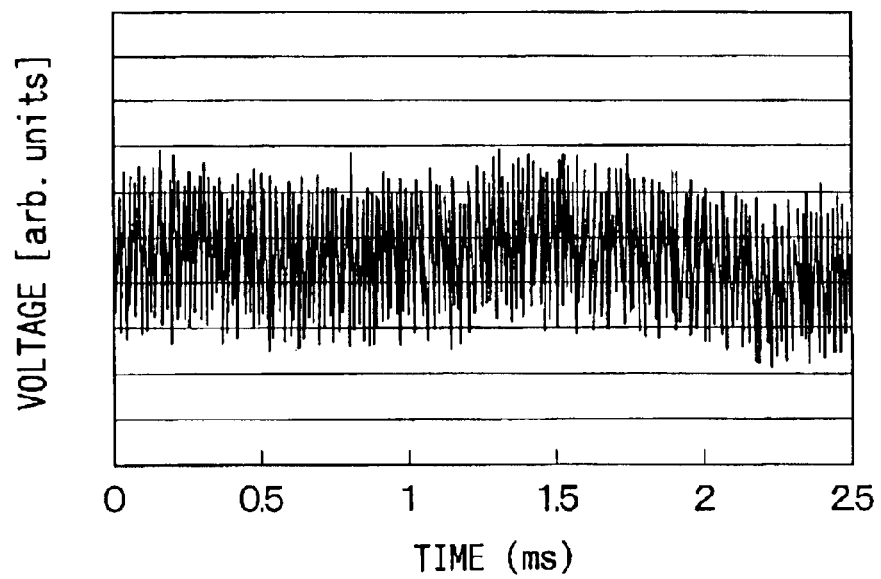
FIGS. 8A and 8B are signal diagrams illustrating waveforms of feedthrough noise when the noise compensation transistor is provided or not provided in the fourth-order filter.
Figure 8B:
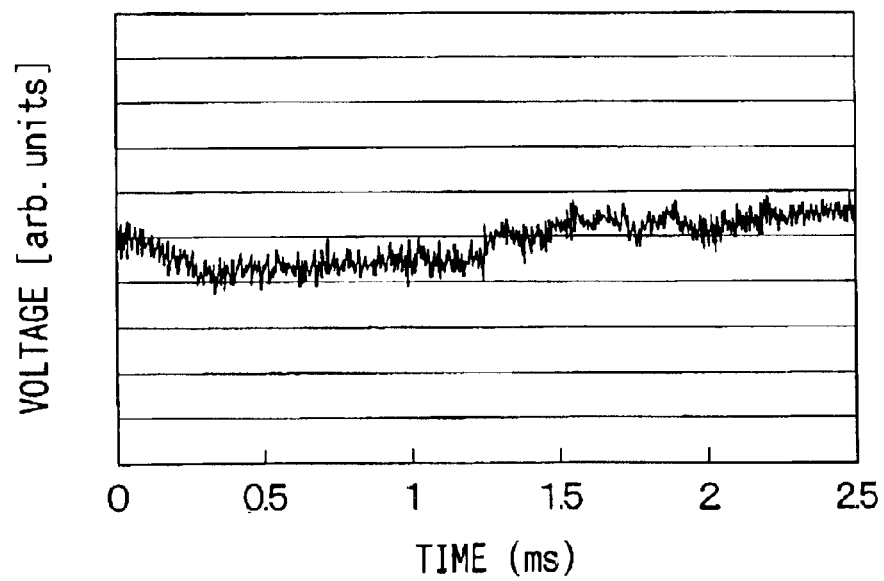

Waveforms of feedthrough noise when a noise compensation transistor is provided or not provided in this fourth-order filter are respectively illustrated in FIGS. 8A and 8B. When the noise compensation transistor is provided, as illustrated in FIG. 8B, feedthrough noise is reduced to a large extent in comparison with the waveforms illustrated in FIG. 8A that shows the case in which the noise compensation transistor is not provided.

As can be understood from the above description, a much higher order filter may be configured by combining the first-order filter and second-order filter and then connecting these filters in series in multiple stages. In this case, offset voltage of feedthrough noise in a high-order filter connected in multiple stages is given adverse effect by capacitance of the final stage. Therefore, it is recommended to provide a noise compensation transistor in the filter of final stage as described above.

Figure 9:
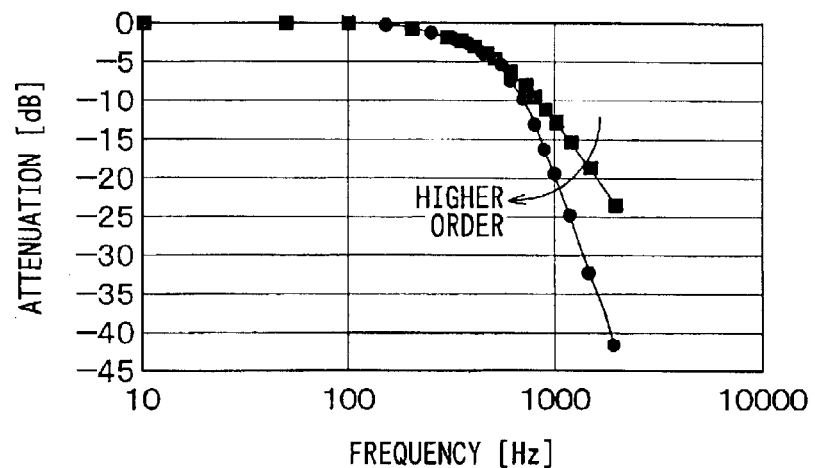
FIG. 9 is a graph illustrating frequency characteristic of filter attenuation coefficient.
Figure 10A:
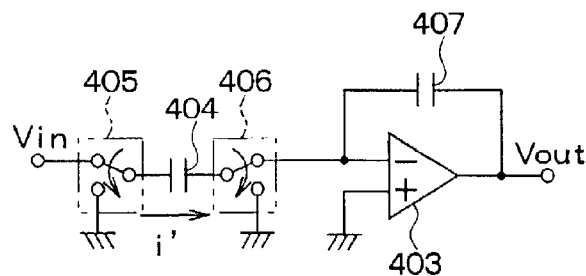
FIGS. 10A and 10B are diagrams illustrating circuit examples of a switched capacitor integration circuit and an analog integration circuit.
Figure 10B:
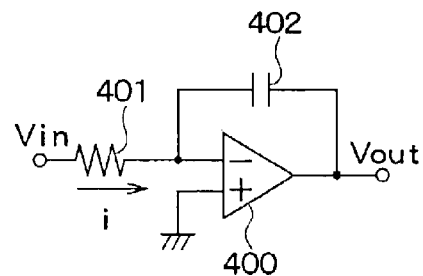

FIG. 9 illustrates frequency characteristics of filter attenuation coefficient of a switched capacitor filter circuit. As illustrated in this figure, the higher the number of orders of filter is, the sharper the frequency characteristics of filter attenuation coefficient becomes like the characteristics of the ideal filter.

(Other Embodiments)

In the first embodiment to third embodiment, cancellation of feedthrough noise in a low-pass filter has been described. However, feedthrough noise can also be cancelled with a noise compensation transistor even in the switched capacitor filter forming a high-pass filter, band-pass filter and band-cut filter, in addition to such low-pass filter.

What is claimed is:

1. A switched capacitor filter circuit comprising:

an input capacitor;

a first switching transistor provided at one terminal side of the input capacitor to perform switching operation when a switching control signal is inputted to a gate thereof;

a second switching transistor provided at the other terminal side of the input capacitor to perform switching operation when the switching control signal is inputted to a gate thereof;

an operational amplifier to which an input voltage is applied to an input terminal thereof via the second switching transistor;

an integration capacitor provided between the input terminal and an output terminal of the operational amplifier to allow application of a voltage across the input terminal and the output terminal; and a first noise compensation transistor connected in series to the second switching transistor between the second switching transistor and the input terminal of the operational amplifier in order to cancel feedthrough noise associated with the input voltage applied to the input terminal, the feedthrough noise being generated by the second switching transistor when a signal of a polarity inverted from the switching control signal is applied to a gate thereof.

2. The switched capacitor filter circuit as in claim 1, further comprising:

a limit capacitor provided in parallel to the integration capacitor between the input terminal and the output terminal of the operational amplifier;

a third switching transistor provided at an input terminal side of the limit capacitor to perform switching operation when the switching control signal is applied to a gate thereof;

a fourth switching transistor provided at an output terminal side of the limit capacitor to perform switching operation when the switching control signal is applied to a gate thereof; and a second noise compensation transistor connected in series to the third switching transistor between the third switching transistor and the input terminal of the operational amplifier to cancel feedthrough noise generated by the third switching transistor when a signal of a polarity inverted from the switching control signal is applied to a gate thereof.

3. A high-order switched capacitor filter circuit having a multiple stages comprising:

an input capacitor;

a first switching transistor provided at one terminal side of the input capacitor to perform switching operation when a switching control signal is inputted to a gate thereof;

a second switching transistor provided at the other terminal side of the input capacitor to perform switching operation when the switching control signal is inputted to a gate thereof;

an operational amplifier to which an input voltage is applied to an input terminal thereof via the second switching transistor;

an integration capacitor provided between the input terminal and an output terminal of the operational amplifier to allow application of a voltage across the input terminal and the output terminal; and a noise compensation transistor provided only in a circuit associated with a final one of the multiple stages and in series connection to the second switching transistor between the second switching transistor and the input terminal of the operational amplifier to cancel feedthrough noise associated with the input voltage applied to the input terminal, the feedthrough noise being generated by the second switching transistor when a signal of polarity inverted from the switching control signal is inputted to a gate thereof.

4. The switched capacitor filter circuit as in claim 1, wherein the noise compensation transistor connects a source and a drain thereof to each other.

5. The switched capacitor filter circuit as in claim 1, wherein the switching transistor has a configuration in which a P-channel type transistor and an N-channel type transistor are connected in parallel and the switching control signal is inputted respectively to one gate thereof while the switching control signal inverted from the switching control signal is inputted to the other gate thereof, and wherein the noise compensation transistor has a configuration in which a P-channel type transistor and an N-channel type transistor of which source terminals and drain terminals are connected are connected in parallel, and the signal of inverted polarity is inputted to one gate thereof, while the signal inverted from the signal of inverted polarity is inputted to the other gate thereof.

6. The switched capacitor filter circuit as in claim 1, wherein gate length and gate width of the second switching transistor are equal to and twice of those of the noise compensation transistor connected between the second switching transistor and the input terminal of the operational amplifier, respectively.

7. A method of fabricating the switched capacitor filter circuit of claim 1, comprising:

forming the input capacitor, the first switching transistor, the second switching transistor, the operational amplifier, the integration capacitor and the first noise compensation transistor on a semiconductor substrate; and forming a plurality of wirings to the input capacitor, the first switching transistor, the switching transistor, the operational amplifier, and the integration capacitor, wherein one of a plurality of wirings is formed to connect in series the first noise compensation transistor to the second switching transistor between the second switching transistor and the input terminal of the operational amplifier in forming the plurality of wirings, only when a ratio of a first capacitance of the second switching transistor to a second capacitance of the integration capacitor is larger than a predetermined value.

8. A method of fabricating the switched capacitor filter circuit of claim 2, comprising:

forming on a semiconductor substrate the input capacitor, the first switching transistor, the second switching transistor, the operational amplifier, the integration capacitor, the first noise compensation transistor, the limit capacitor, the third switching transistor, the fourth switching transistor, and the second noise compensation transistor; and forming a plurality of wirings to the input capacitor, the first switching transistor, the second switching transistor, the operational amplifier, the integration capacitor, the limit capacitor, the third switching transistor and the fourth switching transistor, wherein one of the plurality of wirings is formed to connect in series the first noise compensation transistor to the second switching transistor between the second switching transistor and the input terminal of the operational amplifier in forming the plurality of wirings, only when a ratio of a first capacitance of the second switching transistor to a second capacitance of the integration capacitor is larger than the predetermined value, and a wiring is formed to connect in series the second noise compensation transistor to the third switching transistor between the third switching transistor and the input terminal of the operational amplifier in the step of forming wirings, only when a ratio of a third capacitance of the third switching transistor to the second capacitance of the integration capacitor is larger than the predetermined value.

9. A method of fabricating the higher-order switched capacitor filter circuit of claim 3, comprising:

forming on a semiconductor substrate the input capacitor, the first switching transistor, the second switching transistor, the operational amplifier, the integration capacitor and the noise compensation transistor; and forming a plurality of wirings connecting in series in multiple stages the input capacitor, the first switching transistor, the second switching transistor, the operational amplifier, and the integration capacitor, wherein one of the plurality of wirings is formed to connect in series the circuit associated with the final one of the multiple stages having the noise compensation transistor to the second switching transistor between the second switching transistor and the input terminal of the operational amplifier in forming the plurality of wirings, only when a ratio of a first capacitance of the second switching transistor to a second capacitance of the integration capacitor is larger than a predetermined value in the circuit associated with the final one of the multiple stages.

10. A methods for fabricating a switched capacitor filter circuit having an input capacitor, a first switching transistor coupled to one terminal of the input capacitor, a second switching transistor coupled to another terminal of the input capacitor, an operational amplifier having an input terminal to which an input voltage is applied via the second switching transistor, an integration capacitor provided between the input terminal and an output terminal of the operational amplifier to allow application of a voltage across the input terminal and the output terminal, and a first noise compensation transistor connected in series to the second switching transistor between the second switching transistor and the input terminal of the operational amplifier in order to cancel feedthrough noise associated with the input voltage applied to the input terminal, the feedthrough noise being generated by the second switching transistor when a signal of polarity inverted from the switching control signal is applied to a gate thereof, the method comprising:

forming the input capacitor, the first switching transistor, the second transistor, the operational amplifier, the integration capacitor and the first noise compensation transistor on a semiconductor substrate; and forming a plurality of connections between the input capacitor, the first switching transistor, the switching transistor, the operational amplifier, and the integration capacitor, wherein one of the plurality of connections is formed so as to connect the first noise compensation transistor in series with the second switching transistor between the second switching transistor and the input terminal of the operational amplifier only when a ratio of a first capacitance associated with the second switching transistor to a second capacitance associated with the integration capacitor exceeds a predetermined capacitance threshold.

* * * * *